(12) United States Patent
Chen et al.

(10) Patent No.: US 9,534,803 B2
(45) Date of Patent: Jan. 3, 2017

(54) ENERGY SAVING AIR CONDITIONING SYSTEM AND AIR CONDITIONING METHOD THEREOF

(75) Inventors: Chao-Jung Chen, New Taipei (TW);
Chien-Pang Chen, New Taipei (TW);
Kai-Hung Lin, New Taipei (TW);
Chih-Ming Chen, New Taipei (TW);
Wen-Liang Huang, Taoyuan Shien (TW)

(73) Assignee: Quanta Computer Inc., Taiwan (CN)

( * ) Notice: Subject to any disclaimer, the term of this patent is extended or adjusted under 35 U.S.C. 154(b) by 743 days.

(21) Appl. No.: 13/479,735

(22) Filed: May 24, 2012

(65) Prior Publication Data
US 2013/0105107 A1 May 2, 2013

(30) Foreign Application Priority Data

Nov. 1, 2011 (TW) .............................. 100139803 A

(51) Int. Cl.
| | | |
|---|---|---|
| *B60H 1/00* | (2006.01) | |
| *F24F 11/00* | (2006.01) | |
| *F24F 12/00* | (2006.01) | |
| *H05K 7/20* | (2006.01) | |

(52) U.S. Cl.
CPC ................ *F24F 11/00* (2013.01); *F24F 12/00* (2013.01); *H05K 7/20745* (2013.01); *H05K 7/20836* (2013.01); *F24F 2011/0006* (2013.01)

(58) Field of Classification Search
CPC ............ H05K 7/20145; H05K 7/20172; H05K 7/20181; H05K 7/2059; H05K 7/20618; H05K 7/20654; H05K 7/2069; H05K 7/207; H05K 7/20745; H05K 7/2079; H05K 7/20827; H05K 7/20836; F24F 13/10; F28F 27/00; F28F 27/02
(Continued)

(56) References Cited

U.S. PATENT DOCUMENTS

| | | | | |
|---|---|---|---|---|
| 3,979,922 A | * | 9/1976 | Shavit | ............................... 62/97 |
| 4,210,278 A | * | 7/1980 | Obler | .......................... 236/49.3 |
| 6,415,617 B1 | * | 7/2002 | Seem | .............................. 62/186 |

(Continued)

FOREIGN PATENT DOCUMENTS

| | | |
|---|---|---|
| CN | 2781251 Y | 5/2006 |
| CN | 201096390 | 8/2008 |

(Continued)

OTHER PUBLICATIONS

First Office Action mailed on Dec. 3, 2014 in Chinese Application No. 201110370689.3. (9 pages).
(Continued)

*Primary Examiner* — Travis Ruby
(74) *Attorney, Agent, or Firm* — Nixon Peabody LLP

(57) ABSTRACT

An energy saving air conditioning system is disclosed which provides different air conditioning modes, including a closed-loop mode, an open-loop mode, and a partial-loop mode, for controlling the environment in a high-density apparatus room. The energy saving air conditioning system uses a cloud operating center to monitor the temperature and the moisture inside and outside the high-density apparatus room. The cloud operating system dynamically selects the air conditioning mode in such a manner that energy can be saved and the environment in the high-density apparatus room can be optimally managed.

13 Claims, 7 Drawing Sheets

(58) Field of Classification Search
USPC ....... 165/11.1, 96, 47; 312/236; 361/679.46, 361/679.51, 696; 454/184
See application file for complete search history.

(56) References Cited

U.S. PATENT DOCUMENTS

| | | | |
|---|---|---|---|
| 6,574,104 B2* | 6/2003 | Patel et al. | 361/695 |
| 6,945,058 B2* | 9/2005 | Bash et al. | 62/89 |
| 7,051,946 B2* | 5/2006 | Bash et al. | 236/49.3 |
| 7,355,850 B2* | 4/2008 | Baldwin, Jr. | H05K 7/20563 361/690 |
| 7,630,198 B2* | 12/2009 | Doll | 361/679.49 |
| 2005/0225936 A1* | 10/2005 | Day | 361/687 |
| 2006/0150644 A1* | 7/2006 | Wruck | 62/126 |
| 2006/0234621 A1* | 10/2006 | Desrochers et al. | 454/239 |
| 2008/0185446 A1* | 8/2008 | Tozer | 236/49.4 |
| 2010/0114356 A1* | 5/2010 | Schmitt et al. | 700/117 |
| 2011/0256822 A1* | 10/2011 | Carlson | 454/184 |

FOREIGN PATENT DOCUMENTS

| | | |
|---|---|---|
| CN | 101790299 | 7/2010 |
| CN | 201964583 U | 9/2011 |
| DE | 10 2007 048 926 A1 | 4/2009 |
| JP | 2002-061911 | 2/2002 |
| JP | 2010-261645 | 11/2010 |
| JP | 2010-261696 | 11/2010 |
| JP | 2011-047581 | 3/2011 |
| JP | 2010-255954 | 6/2011 |
| JP | 2011-106698 | 6/2011 |
| TW | 216647 | 11/1993 |
| TW | 427496 | 3/2001 |
| TW | M275370 | 9/2005 |
| TW | I266027 | 11/2006 |
| WO | WO 2011/011404 A1 | 1/2011 |

OTHER PUBLICATIONS

Office Action mailed on Jun. 30, 2015 in Chinese Application No. 201110370689.3 (9 pages).
English Summary of Office Action mailed on Jun. 30, 2015 in Chinese Application No. 201110370689.3.
English Translation Abstract of CN 101790299.

* cited by examiner

ENERGY SAVING AIR CONDITIONING SYSTEM AND AIR CONDITIONING METHOD THEREOF

RELATED APPLICATIONS

This application claims priority to Taiwan Application Serial Number 100139803, filed Nov. 1, 2011, which is herein incorporated by reference.

BACKGROUND

Field of Invention

The present invention relates to an air conditioning system and method thereof.

Description of Related Art

With the rapid development of various technologies and the pervasiveness of computer dependency in enterprises, the demand for server systems is rising. Large companies commonly use tens or even hundreds of low-cost servers or blade servers in order to deal with a large amount of data and Internet traffic. A blade server is an entire server designed to fit on a small plug-and-play card or board, in which CPUs (central processing units), RAM (random-access memory) and hard drives are usually included thereon. Several blade servers can be installed in one rack, sharing the same power supplies, monitor, keyboard and other electronic components while offering potentially easier maintenance. Through such a configuration, the blade servers are integrated while enabling users to efficiently and rapidly access them.

With the rapid development of cloud technology, the loading and efficiency requirements of servers are significantly increased, and as a result, the heat generated by a server rack is also increased. A conventional high-density apparatus room typically utilizes a closed-loop system to realize temperature control of the room, regardless of the external temperature or humidity. Such an air conditioning system consumes a huge amount of energy.

For the foregoing reasons, there is a need for realizing air conditioning in high-density apparatus rooms, especially those used for cloud data centers, in an energy-saving manner.

SUMMARY

An aspect of the invention provides an energy saving air conditioning system which selects a suitable air conditioning mode according to an external environment to thereby save energy through dynamic control.

An aspect of the invention provides an energy saving air conditioning system utilized in a high-density apparatus room. The high-density apparatus room has an air inlet. The energy saving air conditioning system includes an inlet gate for selectively opening or closing the air inlet, an air filter wall, a heat exchanger array including a plurality of heat exchangers and at least one water collector disposed under the heat exchangers, a fan array, a thermal flow channel for collecting hot air in the high-density apparatus room, and a cloud operating center. The thermal flow channel includes a thermal flow outlet leading to a space outside the high-density apparatus room, an outlet gate for selectively opening or closing the thermal flow outlet, a return air outlet leading to a space between the air filter wall and the fan array, and a return wall gate for selectively opening or closing the return air outlet. The cloud operating center controls the inlet gate, the heat exchanger array, the fan array, the outlet gate, and the return air gate.

The fan array includes a plurality of high-pressure centrifugal fans. The energy saving air conditioning system further includes a plurality of sensors connecting to the cloud operating center. The sensors include a plurality of temperature sensors disposed inside and outside the high-density apparatus room, and a plurality of humidity sensors disposed inside and outside the high-density apparatus room. The high-density apparatus room includes a plurality of rack modules. The rack modules are arranged in a back-to-back configuration. The hot air in the high-density apparatus is exhausted by the rack modules, and the hot air exhausted by the rack modules enters the thermal flow channel. The energy saving air conditioning system further includes a wind deflector incline disposed between the rack modules and the fan array. The air inlet, the inlet gate, the air filter wall, the heat exchanger array, the fan array, and the thermal flow channel are sequentially arranged from the air inlet to the rack modules. The energy saving air conditioning system may further include a humidifier.

Another aspect of the invention is an air conditioning method utilizing the energy saving air conditioning system, the method includes selecting an open-loop mode by the cloud operating center, turning off the heat exchanger array, opening the inlet gate for providing an external air to the fan array, opening the outlet gate, closing the return air gate, and turning on the fan array.

Another embodiment of the air conditioning method utilizing the energy saving air conditioning system includes selecting a partial-loop mode by the cloud operating center; opening the inlet gate for providing an external air to the fan array; opening the outlet gate and the return air gate, wherein a part of the hot air is exhausted by the thermal flow outlet, and another part of the hot air is mixed with the external air for adjusting a temperature and humidity of the high-density apparatus room; and turning on the fan array. The air conditioning method further includes turning on the heat exchanger array. It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
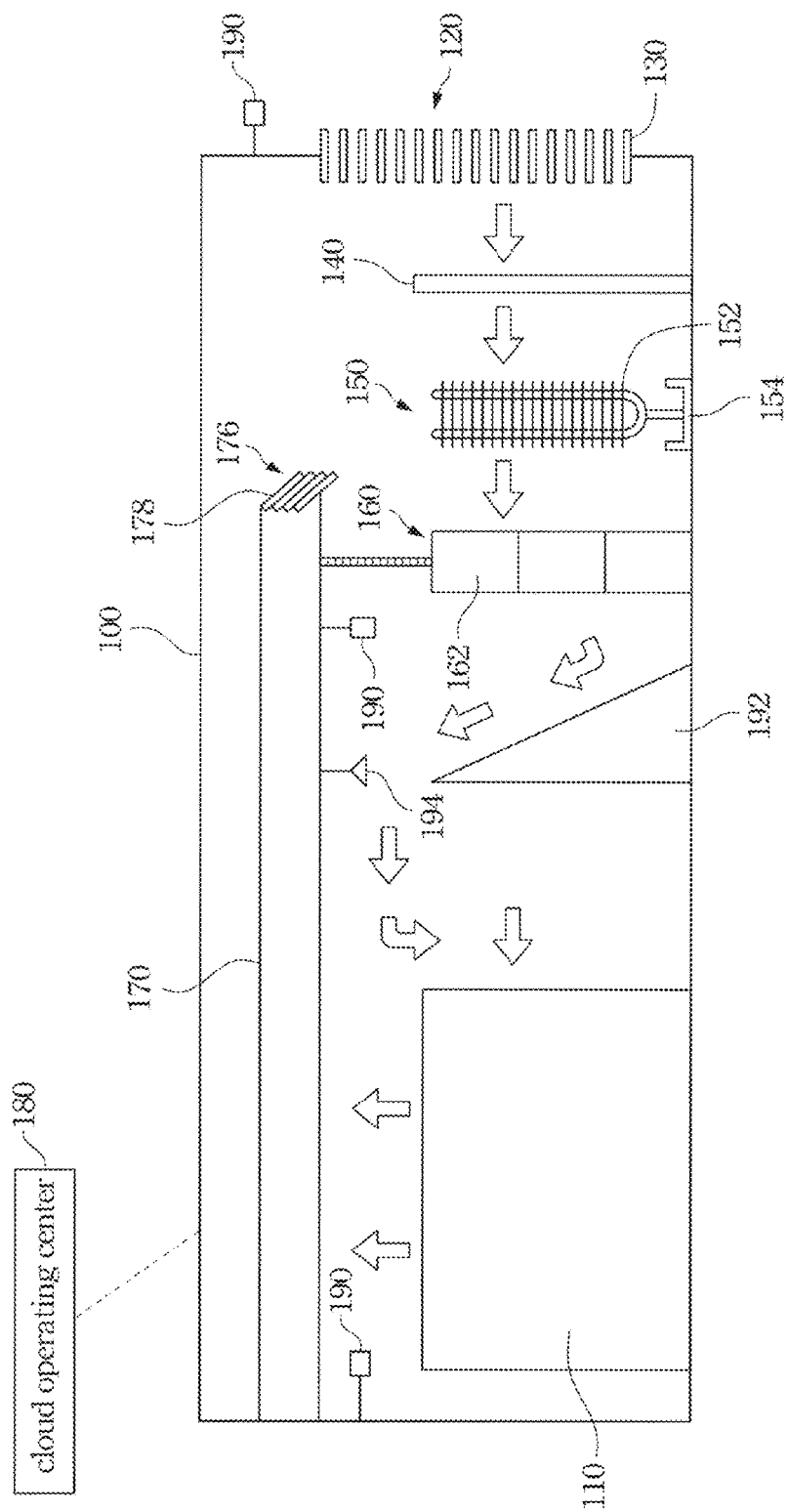
FIG. 1 is a side view of an energy saving air conditioning system of the invention in one air conditioning mode.

Reference will now be made in detail to the present embodiments of the invention, examples of which are illustrated in the accompanying drawings. Wherever possible, the same reference numbers are used in the drawings and the description to refer to the same or like parts.

FIG. 1 is a side view of an energy saving air conditioning system of the invention in one air conditioning mode. The energy saving air conditioning system is utilized in a high-density apparatus room 100. The high-density apparatus room 100 can be a cloud data center. The high-density apparatus room 100 includes a plurality of rack modules 110. Each rack module 110 has at least one server rack and plural severs disposed therein. The high-density apparatus room 100 has an air inlet 120. External air can enter the high-density apparatus room 100 via the air inlet 120.

The energy saving air conditioning system includes an inlet gate 130, an air filter wall 140, a heat exchanger array 150, a fan array 160, a thermal flow channel 170, and a cloud operating center 180. The inlet gate 130, the air filter wall 140, the heat exchanger array 150, the fan array 160, and the thermal flow channel 170 are sequentially arranged from the air inlet 120 to the rack modules 110. The energy saving air conditioning system further includes a plurality of sensors 190 connecting to the cloud operating center 180. The cloud operating center 180 controls the servers in the rack modules 110 and manages the loading of the servers. The cloud operating center 180 further dynamically controls the inlet gate 130, the heat exchanger array 150, and the fan array 160. Data related to the conditions detected by the sensors 190 are sent to the cloud operating center 180.

The fan array 160 includes a plurality of high-pressure centrifugal fans 162 that operate to generate air flow. The air flow generated by the fan array 160 originates from the inlet gate 130 and is directed toward the rack modules 110. Moreover, the fan array 160 guides the air flow in the high-density apparatus room 100, so that a clean and cool air flow passing through the air filter wall 140 and the heat exchanger array 150 can enter and cool the rack modules 110. The inlet gate 130 can be an electric shutter, which opens or closes the air inlet 120 by a command provided by the cloud operating center 180.

More particularly, when the cloud operating center 180 sends a command to open the air inlet 120, the inlet gate 130 is switched, and passages between covers of the electric shutter are exposed. With the placement of the air inlet 120 and the operation of the fan array 160, the air pressure inside the high-density apparatus room 100 is lower than the air pressure outside the high-density apparatus room 100. As a result, external air enters the high-density apparatus room 100 via the open air inlet 120. On the other hand, when the cloud operating center 180 sends a command to close the air inlet 120, the inlet gate 130 is switched again, and passages between covers of the electric shutter are closed to thereby prevent external air from entering the high-density apparatus room 100.

The air filter wall 140 can be a single-layer or a multi-layer structure. The air filter wall 140 may not only include a filter screen, but may also include a photo catalyst, such as titanium dioxide, to further remove unwanted particles, such as sulfide.

The heat exchanger array 150 includes a plurality of heat exchangers 152, and at least one water collector 154 disposed under the heat exchangers 152. The heat exchangers 152 preferably are wet type (water cool type) heat exchangers, which have fluid in the tubes for performing a heat exchange operation. The heat exchanger array 150 not only performs a heat exchange operation to lower the temperature in the high-density apparatus room 100, but also performs the operation of dehumidification when the air humidity is too high. The extra moisture is condensed when the air is cooled after undergoing heat exchange, and the water can be collected by the water collector 154.

The fan array 160 includes plural high-pressure centrifugal fans 162 to guide the cooled and dehumidified air into the rack modules 110 for cooling the servers therein. The fan array 160 can be divided into several segments according to the arrangement of the rack modules 110. The cloud operating center 180 detects the exhausted temperature and the server loading of each rack module 110 and dynamically performs control. In particular, when the cloud operating center 180 detects that the temperature or the server loading of one or more rack modules 110 is increased, the cloud operating center 180 can increase the fan speed of the high-pressure centrifugal fans 162 of the corresponding segment of the fan array 160. On the other hand, when the cloud operating center 180 detects that the temperature or the server of one or more rack modules 110 is reduced, the cloud operating center 180 can reduce the fan speed of the high-pressure centrifugal fans 162 of the corresponding segment of the fan array 160 to thereby save energy.

The sensors 190 are disposed inside and outside the high-density apparatus room 100. The sensors 190 include at least one temperature sensor and at least one humidity sensor disposed at the air inlet 120 for detecting the temperature and the humidity of the external air. The sensors also include at least one temperature sensor and at least one humidity sensor disposed in the high-density apparatus room 100 for detecting the temperature and the humidity in the high-density apparatus room 100. Data corresponding to the temperature and the humidity of the external air and the temperature and the humidity in the high-density apparatus room 100 are sent to the cloud operating center 180, and the cloud operating center 180 can select a proper air conditioning mode according to the detected temperatures and the humidities.

The energy saving air conditioning system may further include a deflector incline 192 disposed between the rack modules 110 and the fan array 160. The deflector incline 192 can provide a passage for people to walk through in order to prevent people from feeling uncomfortable when the fan array 160 is generating a strong air flow. Through such placement of the deflector incline 192, the cooled air can be guided to an upper area in the high-density apparatus room 100 and be mixed with exhausted air (to be described below) for realizing a dehumidifying function and ensuring a uniform temperature within the high-density apparatus room 100.

The energy saving air conditioning system can also include a humidifier 194 disposed in the high-density apparatus room 100 for raising the humidity when the air in the high-density apparatus room 100 is too dry.

Figure 2:
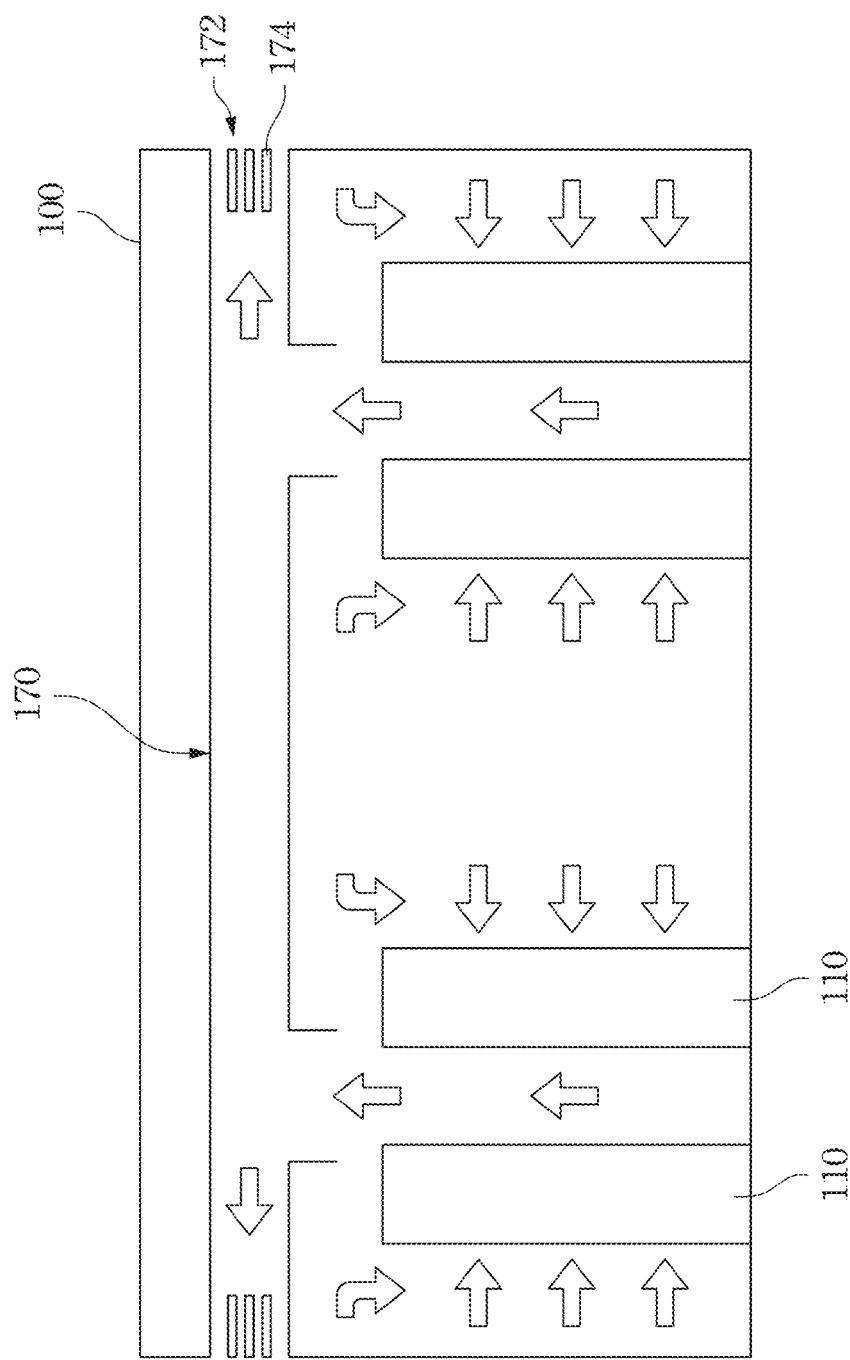
FIG. 2 is a cross-sectional view of FIG. 1 along a rack module.

Reference is now made to both FIG. 1 and FIG. 2. FIG. 2 is a cross-sectional view of FIG. 1 along the rack module 110. The view of FIG. 1 is substantially perpendicular to the view of FIG. 2. Namely, FIG. 1 shows the high-density apparatus room 100 from a long-axis direction thereof, while FIG. 2 shows the high-density apparatus room 100 along a short-axis direction thereof. The rack modules 110 are arranged in a back-to-back configuration, and hot air exhausted by the rack modules 110 can be easily collected by the thermal flow channel 170. The thermal flow channel 170 includes a thermal flow outlet 172, an outlet gate 174, a return air outlet 176, and a return air gate 178. The thermal flow outlet 172 is disposed at an upper side of the high-density apparatus room 100 and leads to a space outside the high-density apparatus room 100 for exhausting the hot air collected from the rack modules 110. The outlet gate 174 can be an electric shutter controlled by the cloud operating center 180 for selectively opening or closing the thermal flow outlet 172. The return air outlet 176 leads to a space between the air filter wall 140 and the fan array 160. The return air gate 178 can be an electric shutter controlled by the cloud operating center 180 for selectively opening or closing the return air outlet 176. The operation of the outlet gate 174 and the return air gate 178 is similar to the operation of the inlet gate 130.

The energy saving air conditioning system utilizes the cloud operating center 180 to collect data of the temperature and the humidity inside and outside the high-density apparatus room 100 detected by the sensors 190, and the cloud operating center 180 further selects a proper air conditioning mode. An air conditioning method utilizing the energy saving air conditioning system is also disclosed in the invention. The method includes an open-loop mode, a closed-loop mode, and partial-loop mode. The cloud operating center 180 selects a proper air conditioning mode among the three modes according to different temperature and humidity levels so as to optimize air conditioning of the high-density apparatus room 100 and to save energy.

The energy saving air conditioning system using the open-loop mode is illustrated in FIG. 1 and FIG. 2. The servers in the rack modules 110 typically have a predetermined preferred operating condition (e.g., temperature and humidity). When the cloud operating center 180 detects that the temperature and the humidity of the external air is lower than the predetermined preferred operating condition, the external air can be directly used to cool the rack modules 110 in the high-density apparatus room 100. In this case, the cloud operating center 180 may select the open-loop mode as a present air conditioning mode. In the open-loop mode, the heat exchanger array 150 is turned off, the inlet gate 130 is opened to enable free flow of the external air, and the fan array 160 is turned on to direct the external air to the rack modules 110 for cooling the rack modules 110. In the open-loop mode, the return air gate 178 is closed, and the open gate 174 is opened, such that the hot air exhausted by the rack modules 110 can be lead to an external space (i.e., the space outside the high-density apparatus room 100) via the thermal flow outlet 174 because of the pressure difference. The heat exchanger array 150 is turned off in the open-loop mode, as described above, thereby saving energy.

Figure 3:
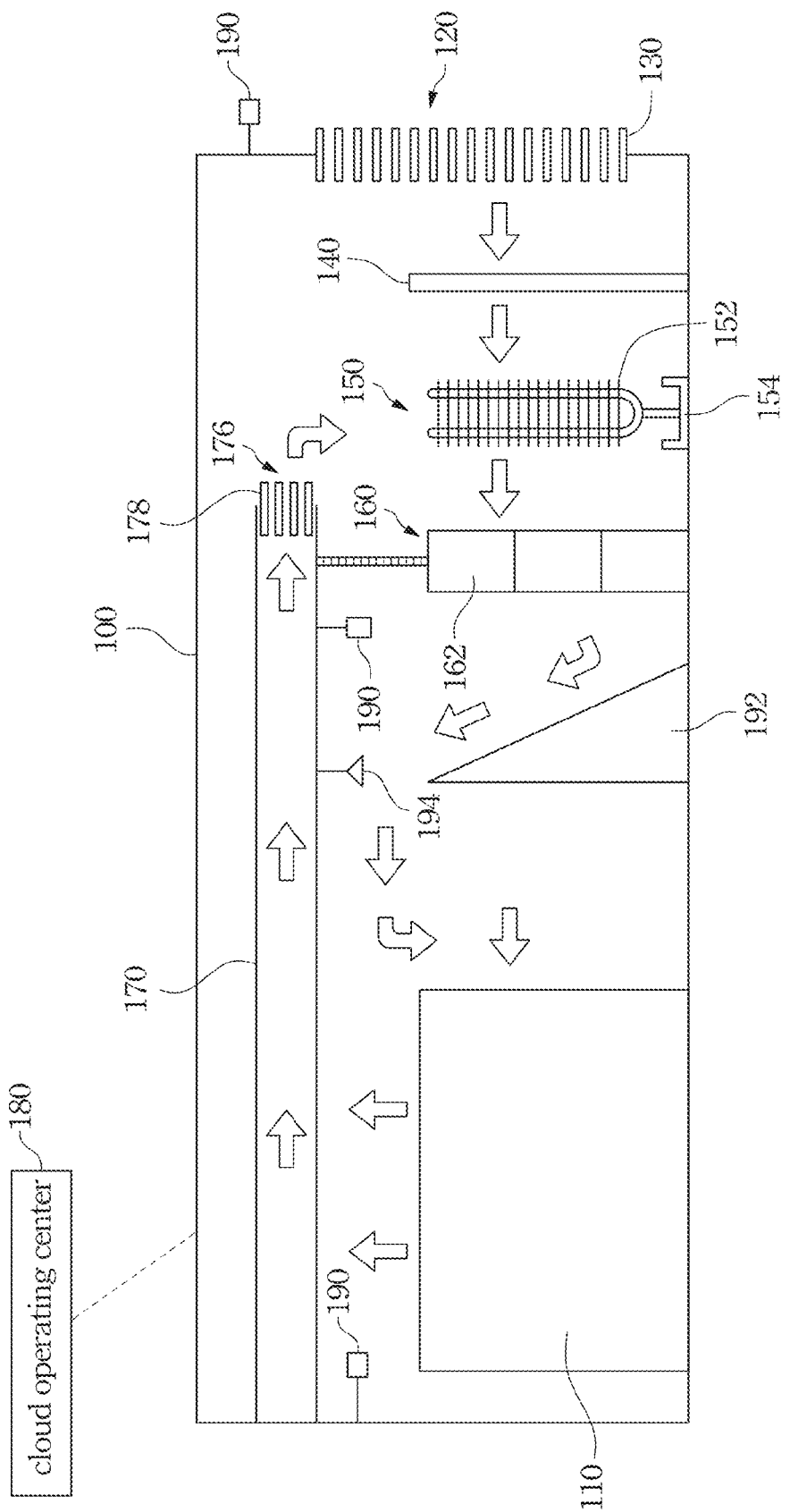
FIG. 3 is a side view of the energy saving air conditioning system of the invention in another air conditioning mode.
Figure 4:
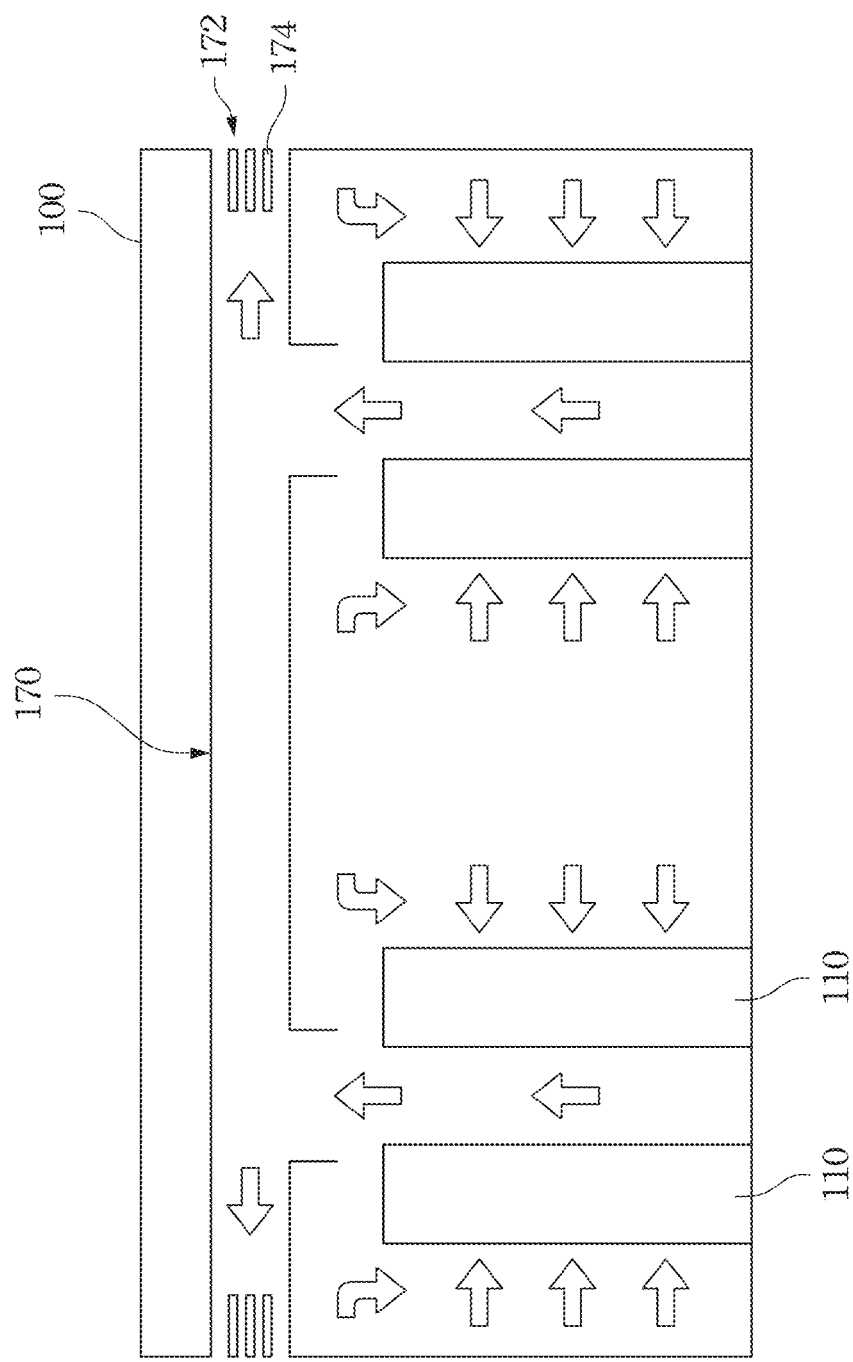
FIG. 4 is a cross-sectional view of FIG. 3 along the rack module.

Reference is now made to both FIG. 3 and FIG. 4. FIG. 3 is a side view of the energy saving air conditioning system of the invention in another air conditioning mode, and FIG. 4 is a cross-sectional view of FIG. 3 along the rack module 110. When the temperature and the humidity of the external air is close to the predetermined preferred operating condition, the cloud operating center 180 selects the partial-loop mode as the present air conditioning mode. In the partial-loop mode, the inlet gate 130 is opened to enable free flow of the external air into the high-density apparatus room 100. The outlet gate 174 and the return air gate 178 are opened. The heat exchanger array 150 is selectively turned on in the partial-loop mode. The external air entering the inlet gate 130 can be cooled by the heat exchanger array 150 and be further mixed with the hot air directed through the return air outlet 176 for being humidified. Alternatively, the external air may undergo only mixing with the hot air directed through the return air outlet 176 for being heated and dehumidified. The external air can be cooled by the heat exchanger array 150 (optional), and be mixed with the hot air directed through the return air outlet 176. The external air mixed with the hot air is then sent to the rack modules 110 by the fan array 160 which is turned on. The hot air exhausted by the rack modules 110 is collected by the thermal flow channel 170. Part of the hot air is directed through the return air outlet 176 and is mixed with the external air, and another part of the hot air is exhausted to the external space via the thermal flow outlet 172.

Figure 5:
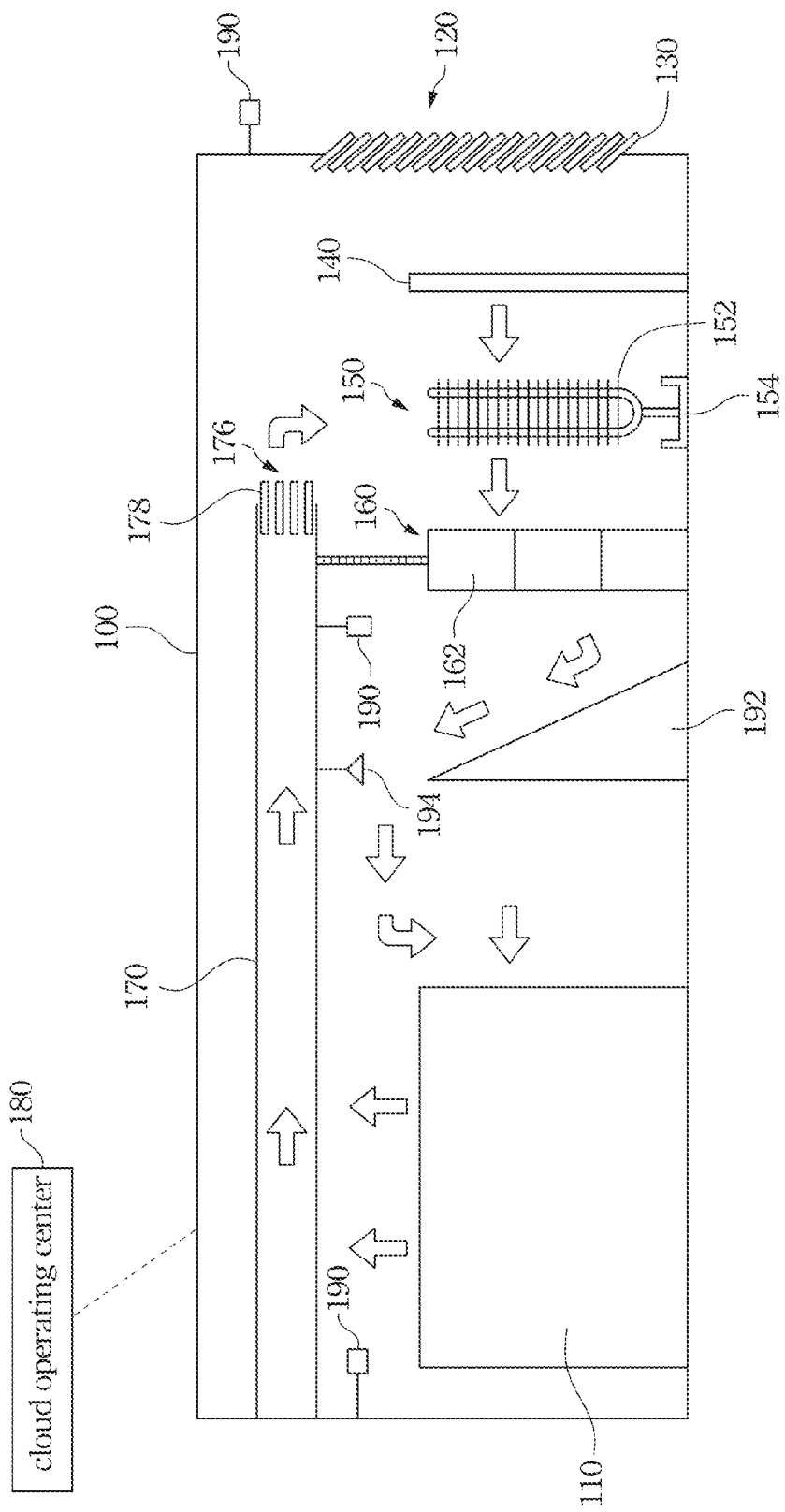
FIG. 5 is a side view of the energy saving air conditioning system of the invention in yet another air conditioning mode.
Figure 6:
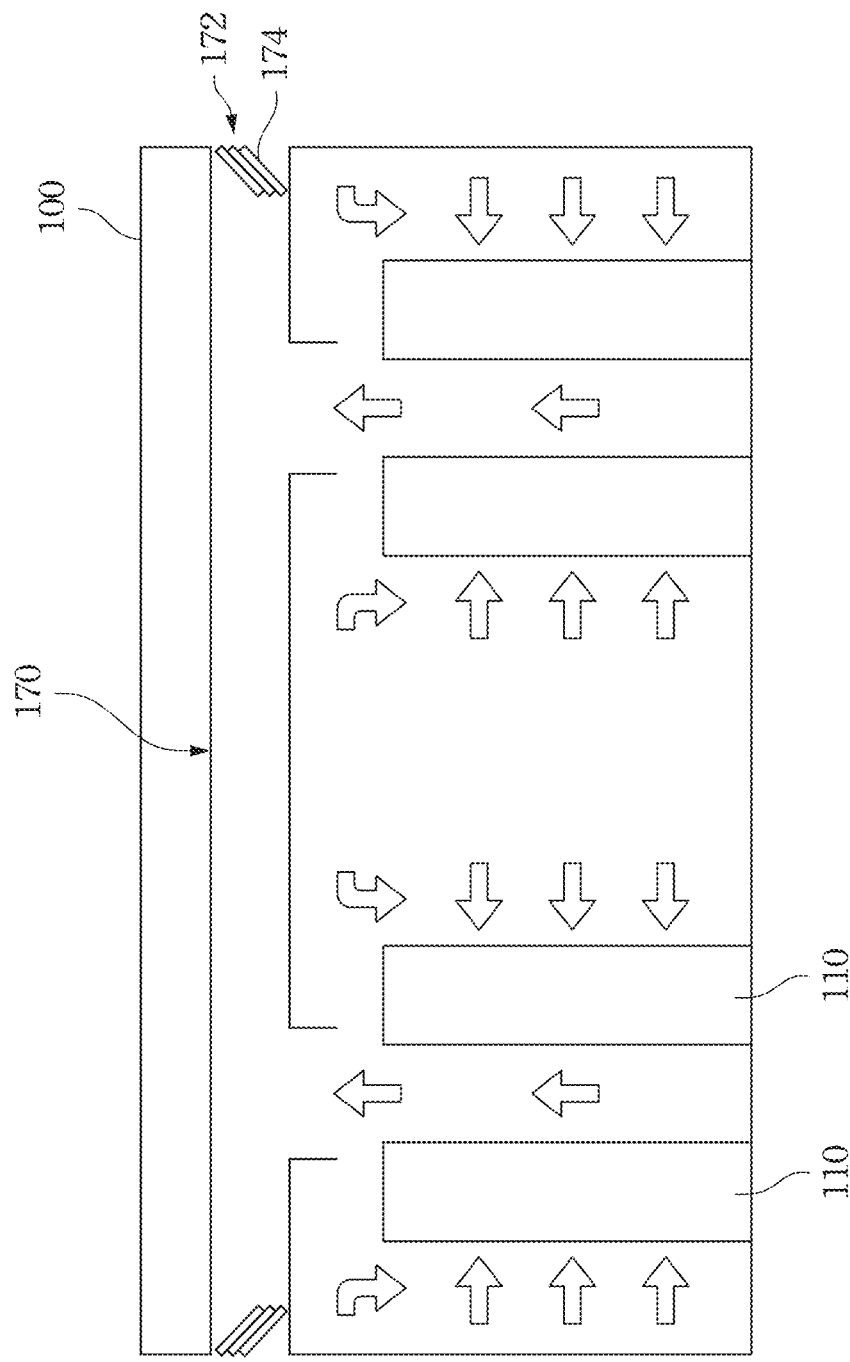
FIG. 6 is a cross-sectional view of FIG. 5 along the rack module.

Reference is now made to both FIG. 5 and FIG. 6. FIG. 5 is a side view of the energy saving air conditioning system of the invention in yet another air conditioning mode, and FIG. 6 is a cross-sectional view of FIG. 5 along the rack module 110. When the temperature and the humidity of the external air is higher than the predetermined preferred operating condition and cannot be used directly, the cloud operating center 180 selects the closed-loop mode as the present air conditioning mode. In the closed-loop air conditioning mode, the inlet gate 130 and the outlet gate 174 are closed, and the return air gate 178 is opened. The hot air exhausted by the rack modules 110 is collected by the thermal flow channel 170 and is sent to the heat exchanger array 150 via the return air outlet 176 for being cooled, and the cooled air is sent to the rack modules 110 via the fan array 140 which is turned on for cooling the rack modules 110.

Figure 7:
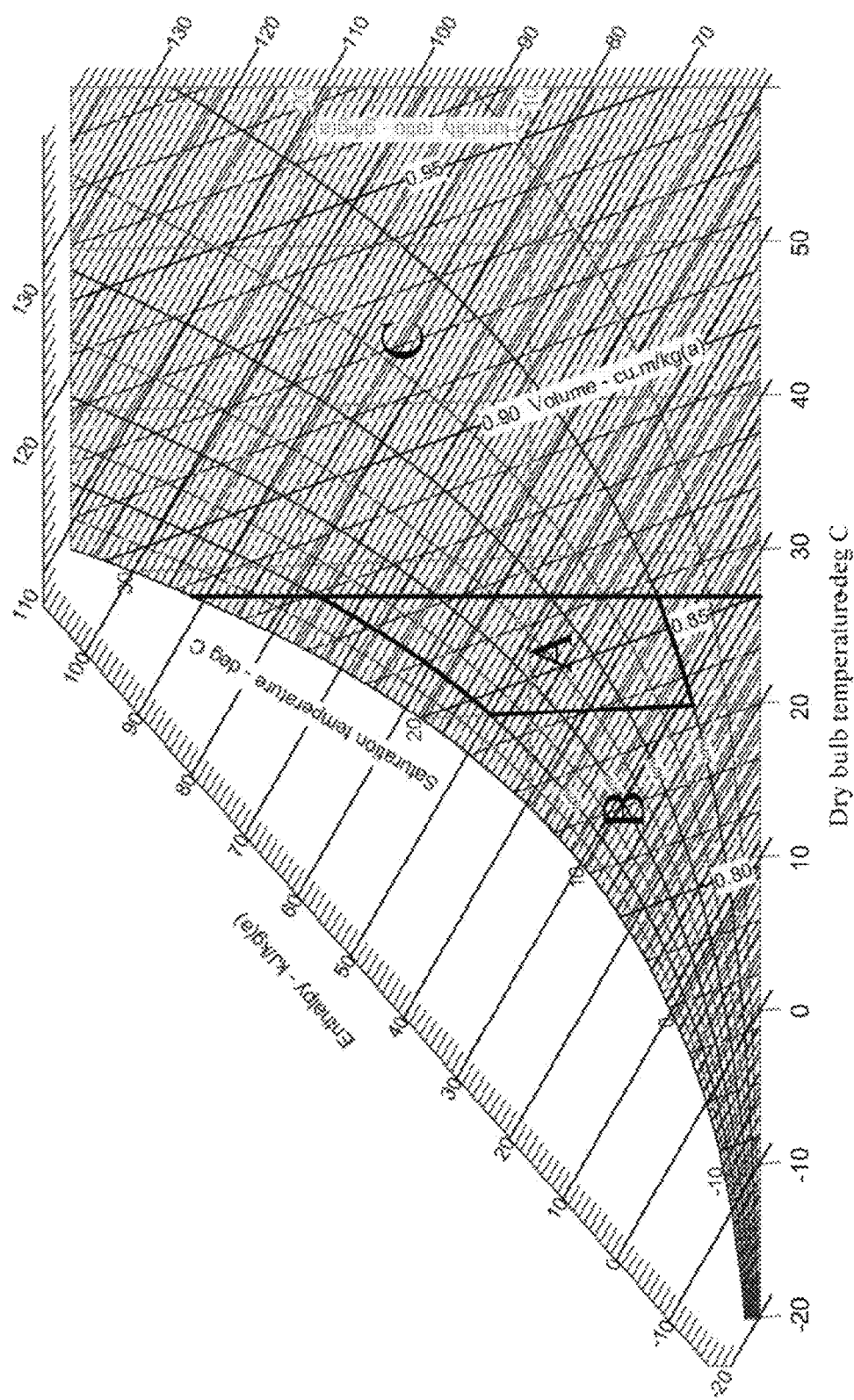
FIG. 7 is a psychrometric diagram of the energy saving air conditioning system of the invention.

FIG. 7 is a psychrometric diagram of the energy saving air conditioning system of the invention.

With reference to FIGS. 1 and 7, the area A in the psychrometric diagram corresponds to the predetermined preferred operating condition. When the external air corresponds to area A, that means the external air can be used directly, and the cloud operating center 180 selects the open-loop mode to be the present air conditioning mode.

When the temperature of the external air is below the highest operating temperature (dry bulb temperature) and it also does not correspond to area A, the external air corresponds to area B, and the cloud operating center selects the partial-loop mode to be the present air conditioning mode. The external air is dehumidified by being mixed with the returned hot air exhausted by the rack modules 110, and the dehumidified air is sent to the rack modules 110. The thermal flow channel 170 can also guide the hot air to the external space, thereby reducing the energy used for cooling. When the temperature of the mixed air, that is, the external air mixed with the exhausted hot air, is too high, then the cloud operating center 180 can turn on the heat exchanger array 150 for cooling the mixed air.

When the temperature of the external air is higher than the highest operating temperature, the external air corresponds to area C, and the cloud operating center 180 selects the closed-loop mode to be the present air conditioning mode. In this case, the inlet gate 130 is closed, and the hot air exhausted by the rack modules 110 is sent to the return air outlet 176 and is cooled by the heat exchanger array 150 and re-circulated.

In some situations, the humidity of the air may be too low. In such a case, the cloud operating center 180 turns on the humidifier 194 to increase the humidity of the air in the high-density apparatus room 100.

The energy saving air conditioning system provides three air conditioning modes including the open-loop mode, the closed-loop mode, and the partial-loop mode. The cloud operating center monitors the temperature and the humidity inside and outside the high-density apparatus room and monitors the loading of the servers in the rack modules to dynamically select among the three air conditioning modes to thereby better control the temperature and humidity in the high-density apparatus room and save energy.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An energy saving air conditioning system utilized in a high-density apparatus room comprising at least one rack module, the high-density apparatus room having an air inlet, the energy saving air conditioning system comprising:
    a cooling flow channel for introducing cooled air in the high-density apparatus room, wherein the cooling flow channel comprises:
        an inlet gate for selectively opening or closing the air inlet;
        an air filter wall;
        a heat exchanger array comprising a plurality of heat exchangers and at least one water collector disposed under the heat exchangers;
        an angled incline for guiding cooled air to an upper-area above the at least one rack module in the high-density apparatus room, wherein the angled incline extends to the upper area; and
        a fan array for directing air from the air inlet through the inlet gate, the air filter wall, and the heat exchanger array to provide the cooled air at the angled incline; and
    a thermal flow channel for collecting air in from the high-density apparatus room, wherein the thermal flow channel comprises:
        a thermal flow outlet leading to a space outside the high-density apparatus room;
        an outlet gate for selectively opening or closing the thermal flow outlet;
        a return air outlet leading to a space between the air filter wall and the fan array; and
        a return wall gate for selectively opening or closing the return air outlet;
        wherein the inlet gate, the heat exchanger array, the fan array, the outlet gate, and the return air gate are controlled from a cloud operating center.

2. The energy saving air conditioning system of claim 1, wherein the fan array comprises a plurality of centrifugal fans.

3. The energy saving air conditioning system of claim 1, further comprising a plurality of sensors connecting to the cloud operating center.

4. The energy saving air conditioning system of claim 3, wherein the sensors comprise:
    a plurality of temperature sensors disposed inside and outside the high-density apparatus room; and
    a plurality of humidity sensors disposed inside and outside the high-density apparatus room.

5. The energy saving air conditioning system of claim 1, wherein the high-density apparatus room comprises a plurality of rack modules, the rack modules are arranged in a back-to-back configuration, the hot air in the high-density apparatus room is exhausted by the rack modules, and the hot air exhausted by the rack modules enters the thermal flow channel.

6. The energy saving air conditioning system of claim 5, wherein the air inlet, the inlet gate, the air filter wall, the heat exchanger array, the fan array, and the thermal flow channel are sequentially arranged from the air inlet to the rack modules.

7. The energy saving air conditioning system of claim 1, further comprising a humidifier.

8. The energy saving air conditioning system of claim 1, wherein the cloud operating center is configured for operating in an open-loop mode, and wherein the controlling of the inlet gate, the heat exchanger array, the fan array, the outlet gate, and the return air gate further by the cloud operating center operating in the open-loop mode comprises:
    turning off the heat exchanger array;
    opening the inlet gate for providing an external air to the fan array;
    opening the outlet gate;
    closing the return air gate; and
    turning on the fan array.

9. The energy saving air conditioning system of claim 1, wherein the cloud operating center is configured for operating in a partial-loop mode, and wherein the controlling of the inlet gate, the heat exchanger array, the fan array, the outlet gate, and the return air gate further by the cloud operating center comprises:
    opening the inlet gate for providing an external air to the fan array;
    opening the outlet gate and the return air gate, wherein a part of the hot air is exhausted by the thermal flow outlet, and another part of the hot air is mixed with the external air for adjusting a temperature and humidity of the high-density apparatus room; and
    turning on the fan array.

10. The energy saving air conditioning system of claim 9, wherein operating in the partial-loop mode further comprises configuring the cloud operating center for turning on the heat exchanger array.

11. An air conditioning method utilizing the energy saving air conditioning system of claim 1, the method comprising:
    selecting an open-loop mode by the cloud operating center;
    turning off the heat exchanger array;
    opening the inlet gate for providing an external air to the fan array;
    opening the outlet gate;
    closing the return air gate; and
    turning on the fan array.

12. An air conditioning method utilizing the energy saving air conditioning system of claim 1, the method comprising:
    selecting a partial-loop mode by the cloud operating center;
    opening the inlet gate for providing an external air to the fan array;
    opening the outlet gate and the return air gate, wherein a part of the hot air is exhausted by the thermal flow outlet, and another part of the hot air is mixed with the external air for adjusting a temperature and humidity of the high-density apparatus room; and
    turning on the fan array.

13. The air conditioning method of claim 12, further comprising turning on the heat exchanger array.

* * * * *